United States Patent [19]
Brigati et al.

[11] Patent Number: 6,011,717
[45] Date of Patent: Jan. 4, 2000

[54] EEPROM MEMORY PROGRAMMABLE AND ERASABLE BY FOWLER-NORDHEIM EFFECT

[75] Inventors: Alessandro Brigati, Aix en Provence; Nicolas Demange, Lessy; Maxence Aulas, St Haon le Vieux; Marc Guedj, Pont Saint Esprit, all of France

[73] Assignee: STMicroelectronics S.A., Saint Genis, France

[21] Appl. No.: 08/666,849

[22] Filed: Jun. 19, 1996

[30] Foreign Application Priority Data

Jun. 21, 1995 [FR] France .................................. 95 07622

[51] Int. Cl.[7] .................................................. G11C 16/00
[52] U.S. Cl. .............................. 365/185.18; 365/185.05; 365/185.11; 365/185.23; 365/185.28; 365/185.29; 365/218
[58] Field of Search ........................ 365/185.23, 185.28, 365/185.29, 185.05, 185.11, 185.18, 218

[56] References Cited

U.S. PATENT DOCUMENTS

| | | | |
|---|---|---|---|
| 5,077,691 | 12/1991 | Haddad et al. ................. | 365/185.29 X |
| 5,392,253 | 2/1995 | Atsumi et al. .................. | 365/185.11 X |
| 5,477,499 | 12/1995 | Van Buskirk et al. ........ | 365/185.18 X |
| 5,619,449 | 4/1997 | McIntyre ......................... | 365/185.18 X |
| 5,627,780 | 5/1997 | Malhi ............................... | 365/185.18 X |
| 5,687,120 | 11/1997 | Chang et al. .................. | 365/185.18 X |

FOREIGN PATENT DOCUMENTS

| | | |
|---|---|---|
| 0 332 274 | 9/1989 | European Pat. Off. . |
| 0 637 035 | 2/1995 | European Pat. Off. . |

*Primary Examiner*—Do Hyun Yoo
*Attorney, Agent, or Firm*—Wolf, Greenfield & Sacks, P.C.

[57] ABSTRACT

An EEPROM is organized in matrix form in word lines and bit lines. Storage cells are placed at the intersections of these lines. The cells include floating gate storage transistors. Groups of cells having separate bit lines but sharing a word line are created. Each group is connected to a group selection transistor. The group selection transistor selectively connects the control gates of the storage transistors to control lines, which provide potentials for enabling programming, erasure or reading of the storage transistors.

35 Claims, 3 Drawing Sheets

EEPROM MEMORY PROGRAMMABLE AND ERASABLE BY FOWLER-NORDHEIM EFFECT

BACKGROUND OF THE INVENTION

1. Field of the Invention

The invention relates to electrically erasable programmable read-only memories known as EEPROMs. More particularly, it pertains to an architecture of an EEPROM that is programmable and erasable by Fowler-Nordheim effect.

The storage cells of EEPROMs are generally formed by a floating-gate storage transistor and a selection transistor enabling the connection of the storage transistor to a word line and a bit line. The EEPROMs use the principle of the non-volatile storage of charges at the floating gate of the floating-gate transistor. Conventionally, the writing (hereinafter designated by the term "programming") is done through the injection by tunnel effect of electrons from the drain or the source into the floating gate (or from the floating gate into the drain or the source), and the erasure is done through injection by tunnel effect of electrons from the floating gate into the drain or the source (or from the drain or the source into the floating gate). There also exist known EEPROMs called flash EEPROMs. In these memories, there is no selection transistor, and the storage transistors are directly connected to the word and bit lines. In this case, a total erasure of the storage cells is performed. This type of memory makes it possible to reduce the amount of space required by the memory while at the same time retaining equivalent storage capacity.

2. Description of the Related Art

The injection of electrons from the drain (or the source) into the control gate of a storage transistor is conventionally done by the ground connection of the drain (or source) of this transistor, the application of a relatively high positive voltage (on the order of +15 volts) to its control gate to create an attracting field and the application of a moderate positive voltage (+6 to +9 volts) to the source (or the drain) to generate hot electrons. When a sufficiently large number of negative charges have collected at the floating gate, the potential of the floating gate reaches the threshold potential of the transistor and prevents the passage of current into a read mode.

The injection of electrons from the floating gate into the drain (or the source) is done by the application of a relatively high positive voltage (+15 volts) to the drain (or the source), the control gate of the storage transistors being ground-connected, and the source (or the drain) being floating. The negative charges are then extracted from the floating gate and directed towards the drain (or the source) by Fowler-Nordheim effect. The thickness of the oxide between the floating gate and the drain (or the source) must be low enough (in the range of 100 Angstroms or less) to enable the injection by Fowler-Nordheim effect.

This type of memory has drawbacks, especially when effecting the ejection of the electrons from the floating gates:

the drain-substrate current (or source-substrate current) during ejection is relatively high and in practice makes it necessary, for large capacity memories, to have available a high positive voltage source that is external to the circuit, a relatively high reverse voltage is generated between the drains (or the sources) and the substrate during the ejection. In practice this makes it necessary to use drains (or sources) with dual diffusion, thus reducing the density of implementation of the cells, the application of a relatively high positive voltage during the erasure on the drains (or the sources) increases the probability of the creation of hot holes by avalanche effect on the surface of the drain-substrate junction (or source-substrate) junction, these holes being trapped in the thin oxide located beneath the floating gate.

For more details on these phenomena, reference may be made to the U.S. Pat. No. 5,077,691 by Advance Micro Devices Inc.

In this document, it is proposed to erase the cells by the application of a relatively high negative voltage (−12 to −17 volts) to the control gates, a relatively low positive voltage (+0.5 to +5 volts) being imposed on the sources, with the substrate being connected to the ground and the drains being left in a state of high impedance. Thus, it is possible to induce a Fowler-Nordheim effect while at the same time keeping a reverse source-substrate voltage lower than +5 volts. The leakage current from the source to the substrate is reduced, enabling the memory to be supplied with a single source of external positive voltage (+5 volts). Furthermore, it enables the use of sources comprising a single diffusion, thus limiting the surface area of the cells. Finally, it is possible to eliminate the creation of hot holes. This increases the reliability of the memory.

SUMMARY OF THE INVENTION

An aim of the present invention is to propose an EEPROM memory having an operation of the same type as the one described above and a structure such that the erasure of the storage cells is done selectively by groups of bits.

Thus, the present invention proposes an EEPROM memory organized in matrix form in N word lines and M bit lines, N and M being integers, and comprising:

storage cells placed at the intersections of the word lines and the bit lines, these storage cells comprise floating-gate storage transistors with N type doping to store electrical states, the storage cells are grouped together in groups of K cells, K being an integer, the cells of one and the same group are connected to one and the same word line and to K distinct bit lines, first selection lines and control lines associated with the groups of cells to convey selection and control potentials, one first P type group selection transistor per group of cells in order to achieve the connection, through its channel, of the floating gates of the storage transistors of one and the same group of cells to one of the control lines, the control gate of the first selection transistor being connected to one of the first selection lines when it is desired to program, erase or read the contents of the cells of the group of cells with which the first group selection transistor is associated.

In a preferred embodiment, the memory has second selection lines associated with the groups of cells and with at least one reference line to convey selection and reference potentials, and one second P type group selection transistor per group of cells in order to achieve the connection, through its channel, of the floating gates of the storage transistors of one and the same group of cells to the reference line, the control gate of the second selection transistor being connected to one of the second selection lines, in such a way that the potentials of the control gates of the storage transistors of the cells of the associated group are in a non-floating state when these control gates are insulated from the control line associated with the group of cells.

BRIEF DESCRIPTION OF THE DRAWINGS

Other features and advantages shall appear from the following description of exemplary embodiments of the invention, made with reference to the appended drawings, of which.

DETAILED DESCRIPTION

Figure 1:
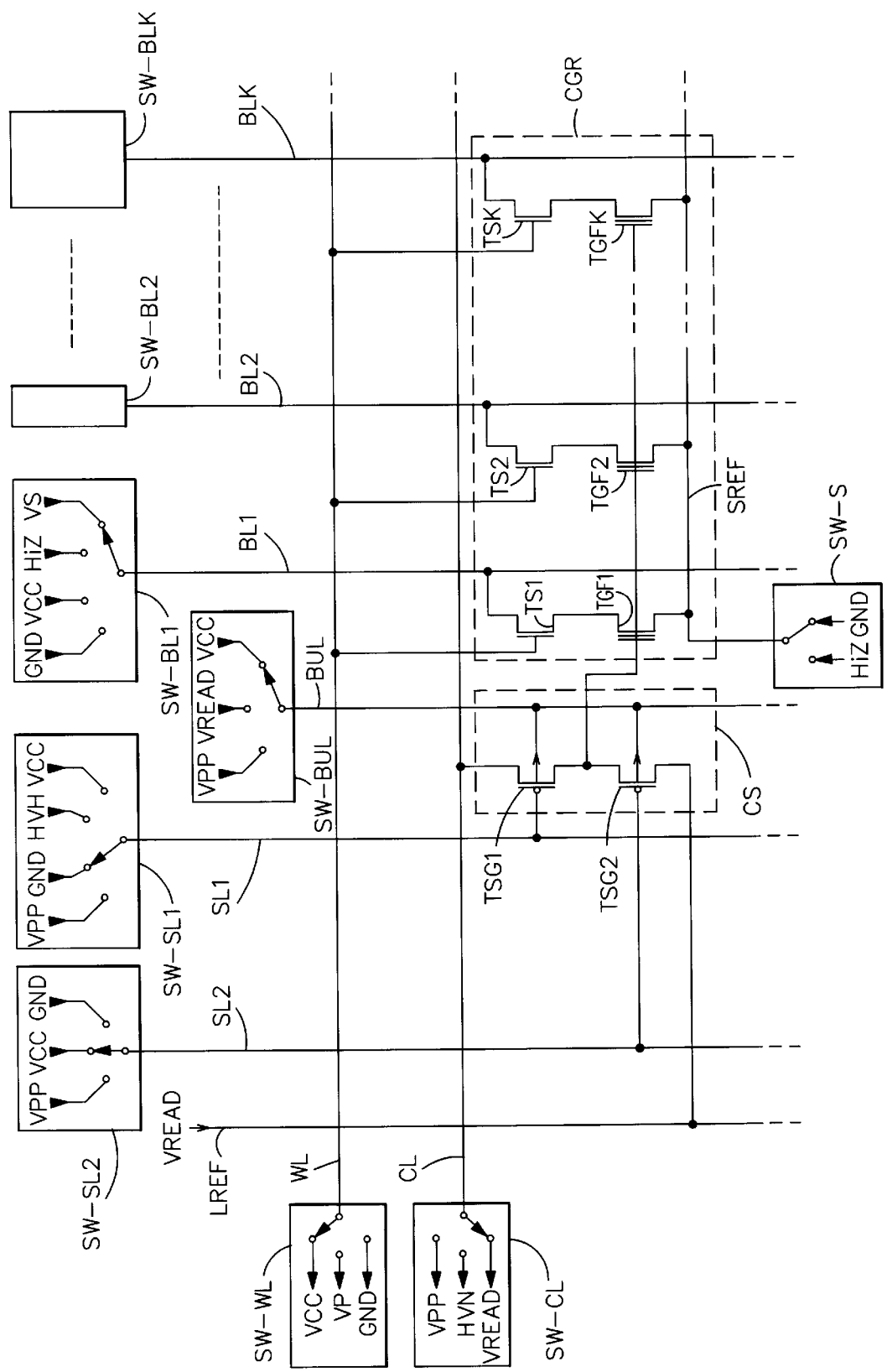
FIG. 1 gives a schematic view of a first exemplary embodiment of the invention.

FIG. 1 gives a schematic view of a first exemplary embodiment of the present invention.

This Figure shows a part of an EEPROM memory erasable by groups of K storage cells, with K as an integer, and made according to the invention. Typically, K will be equal to eight.

It is assumed that this memory is organized in matrix form in N word lines WL and M bit lines BL, N and M being integers.

This memory has storage cells placed at the intersections of the word lines and the bit lines, each of the cells being in an electrical state representing a binary logic state. The cells of one and the same group are connected to the same word line and to K distinct bit lines.

FIG. 1 shows a word line WL and a group CGR of storage cells connected to this word line. Each of the K cells (not all shown) is respectively connected to one bit line among K bit lines bearing the references BL1 to BLK. It will be understood of course that a memory made in accordance with the invention could contain a number of storage cells equal to several tens or several hundreds of thousands of storage cells or more.

The K cells of the groups of cells CGR each include a selection transistor respectively referenced TS1 to TSK and a floating gate storage transistor respectively referenced TGF1 to TGFK. In the example described, it will be assumed that the memory is made in a standard way, by MOS technology, from a P type substrate. The selection and storage transistors are N type transistors. Selection transistors TS1 to TSK have their drain connected respectively to the bit lines BL1 to BLK. Their control gates are connected to the word line WL. Finally, each of the selection transistors TS1 to TSK has its source connected respectively to the drain of the floating-gate storage transistors TGF1 to TGFK. The selection transistors enable the connection or insulation of the drains of the floating-gate storage transistors TGF1 to TGFK of the bit lines BL1 to BLK.

The control gates of the floating-gate storage transistors of the group CGR are connected to one another and to a group selection circuit CS whose composition is described below.

It will be assumed that the sources of the floating-gate storage transistors TGF1 to TGFK of the storage cells of the memory are all connected to a common source line SREF.

The selection circuit CS comprises a first transistor and a second transistor called group selection transistors, respectively referenced TSG1 and TSG2. These are two P type transistors. Their drains are connected to one another and to the control gates of the floating-gate storage transistors TGF1 to TGFK.

The first group selection transistor TSG1 has its source connected to a so-called control line, referenced CL. Its control gate is connected to a first line called a selection line referenced SL1.

The second group selection transistor TSG2 has its source connected to the so-called reference line, referenced LREF.

Its control gate is connected to a second line called a selection line, referenced SL2.

The two group selection transistors TSG1 and TSG2 have their wells connected to a common well line referenced BUL. It will be assumed that all the wells of the group selection transistors associated with the group of cells of the memory are connected to this line BUL, each group having an associated selection circuit comprising two group selection transistors.

The lines CL, LREF, SL1 and SL2 are conductive lines enabling the control gates of the floating-gate storage transistors TGF1 to TGFK to be taken to different potentials, depending on whether or not the cells selected are cells that include these transistors, in order to read, program or erase their contents.

The memory comprises:

a source switching circuit SW-S connected to the common source line SREF enabling the control of the potential of this source line, N word line switching circuits SW-WL each connected to one of the N word lines WL to control the potentials of the word lines, M bit line switching circuits SW-BL each connected to one of the M bit lines BL to control the potentials of the bit lines, first and second selection line switching circuits SW-SL1 and SW-SL2 respectively connected to the first and second selection lines to control the potentials of these lines, a well switching circuit SW-BUL connected to the common well line BUL to control the potential of this line.

As stated, the contents of the cells are determined through the electrical characteristics of the floating-gate transistors. More specifically, the contents of the cells will be qualified with respect to the presence or the absence of electrons at the floating gates. In one reading mode of a cell, a positive read voltage will be imposed on the drain of its floating-gate storage transistor, the selection transistor of the cell being on and the source of the floating-gate transistor being connected to the ground. The value of the current flowing through the storage transistor channel will vary according to the presence or non-presence of electrons at the floating gate of this floating-gate storage transistor, its control gate being positively biased in an appropriate way. By a comparison of this current, which flows through the associated bit line, with a reference current, the electrical state of the cell and hence its information content will be determined.

In the example described, it will be assumed for example that the presence of electrons represents an erased state and that the absence of electrons represents a program state. It is also possible to accept the converse convention. No description shall be given herein of the devices (read amplifiers, word line decoders and bit line decoders, etc.) that conventionally form a memory. The present invention pertains specifically to the architecture of the memory map.

A distinction will be made between three types of operations on the cells.

In a first mode, called a programming mode, electrons from the floating gates of the storage transistors will be injected into their drains.

In a second mode, called an erasure mode, electrons from the drains of the floating-gate storage transistors will be injected into their floating gates.

In a third mode, called a reading mode, the storage transistors will be biased so that they are turned on, so that the value of the current that flows through their channel depends on the electrical state of their floating gate.

In these different modes, the selection lines SL1 and SL2, control line CL, reference line LREF, common source line SREF, common well line BUL, word line WL and bit line BL will be taken to different potentials.

In the example shown, the following potentials are used:

a ground potential GND=0 V and a supply potential VCC=+5 V (given from the exterior), an erasure potential VPP=+15 V, a programming potential HVN=−8 V, a programming control voltage HVH=−10 V, a potential for the selection of word lines in programming mode VP=+7 V, a potential for the selection of bit lines in reading mode VS=+2 V.

a potential for the control of reading VREAD=+2.3 V.

HiZ will refer to a state of high impedance.

Typically, the potentials GND and VCC are available at the connection pins of the memory. The other potentials will be preferably produced internally to the memory, thus making it possible to limit the number of connection pins of the memory. The potentials of absolute value that are greater than the value of VCC shall be produced typically from voltage step-up circuits commonly called charge pumps, the making of which is well known to those skilled in the art.

The source switching circuit SW-S enables the potential of the common source line SREF to be taken to the ground potential GND or this line can be placed in a state of high impedance.

The N word line switching circuits SW-WL enable the potential of the word lines WL to be taken to one of the potentials VCC, VP or GND.

The M bit line switching circuits SW-BL enable the potential of the bit lines BL to be taken to one of the potentials VCC, VS, or GND or these lines can be placed in a state of high impedance.

The first selection line switching circuits SW-SL1 enable the potential of the first selection lines SL1 to be taken to one of the potentials VCC, VPP, HVH or GND.

The second selection line switching circuits SW-SL2 enable the potential of the second selection lines SL2 to be taken to one of the potentials VCC, VPP or GND.

The well switching circuit SW-BUL enables the potential of the common well line BUL to be taken to one of the potentials VCC, VPP or VREAD.

Finally the reference line LREF is held at the potential VREAD.

These switching circuits, the making of which will entail no difficulty to those skilled in the art shall not be described in detail.

The memory has N control lines so that all the groups of cells connected to one and the same word line WL have their first group selection transistors TSG1 connected to one and the same control line CL.

Advantageously, the switching circuits SW-CL and SW-SL1 will be controlled in such a way that only one group of cells connected to one and the same word line WL is connected simultaneously to the control line CL associated with this word line. By proceeding in this way, the number of control gates of the floating-gate storage transistors simultaneously connected to a control line CL is limited to K. Consequently, the induced equivalent capacitance perceived by this line CL is limited. Hence, there will be a limiting of the build-up time to the potential of this line required by the control gates that are connected to this line.

The groups of cells whose cells are connected to K same bit lines have their first selection transistor TSG1 connected to one and the same first selection line SL1. Consequently, there will be a first selection line SL1 for K bit lines, thus limiting the space requirement of the memory.

Similarly, with a view to achieving compactness, the groups of cells whose cells are connected to K same bit lines will advantageously have their second group selection transistor TSG2 connected to one and the same second selection line SL2. There will thus be a second selection line SL2 for K bit lines.

The groups of cells whose cells are connected to K same bit lines have their second group selection transistor TSG2 connected to one and the same reference line LREF. Thus there is provided a reference line LREF for K bit lines, thus limiting the space requirement of the memory. It will be noted that it is possible to achieve the mutual interconnection of the reference lines running parallel to the bit lines. This will mean having only one reference line. Indeed, these reference lines are constantly taken to the same potential VREAD.

The reference lines LREF are used in such a way that the potentials of the control gates of the floating-gate transistors of the group cells are in a non-floating state when these control gates are insulated from the control line CL. This prevents a disturbance of the electrical states of the floating-gate storage transistors which could be modified by capacitive coupling. This would lead to variations in the characteristics whose magnitude could depend on the cells. This is not desirable. For example, the behavior of the cells in reading mode could be variable, thus inducing variations in reaction time and even uncertainty regarding the information content of the cells.

Figure 4:
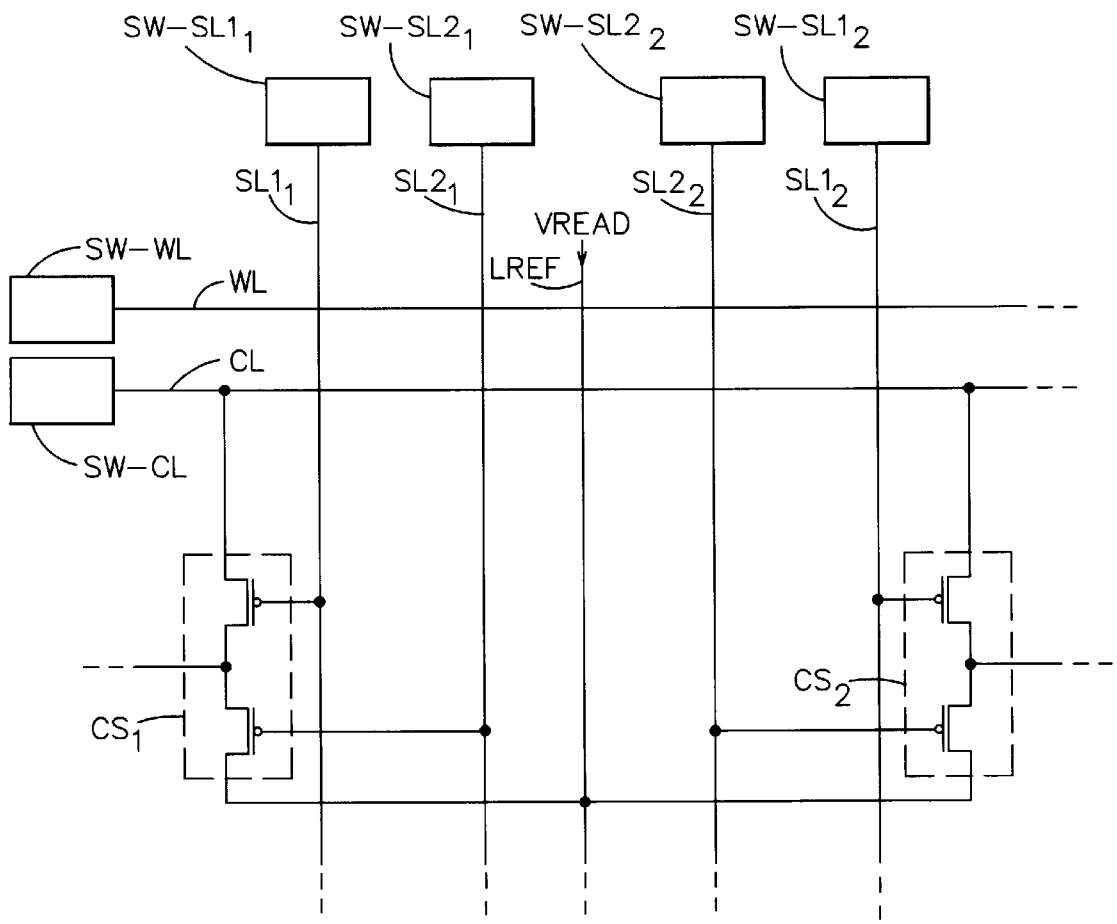
FIG. 4 gives a schematic view of a fourth exemplary embodiment of the invention.

Advantageously, since the bit lines will be grouped in sets of K lines, these sets will be grouped two by two in such a way that the groups of cells for which the cells are connected to either of the two sets of K bit lines grouped together will have their second group selection transistor TSG2 connected to one and the same reference line LREF. Thus, the space requirement due to the reference lines is halved. This is shown in FIG. 4 which shows two selection circuits CS1 and CS2 connected to one and the same control line CL. The circuits CS1 and CS2 are respectively connected to first selection lines SL11 and SL12, second selection lines SL21 and SL22 and a reference line LREF placed between the circuits CS1 and CS2.

Figure 3:
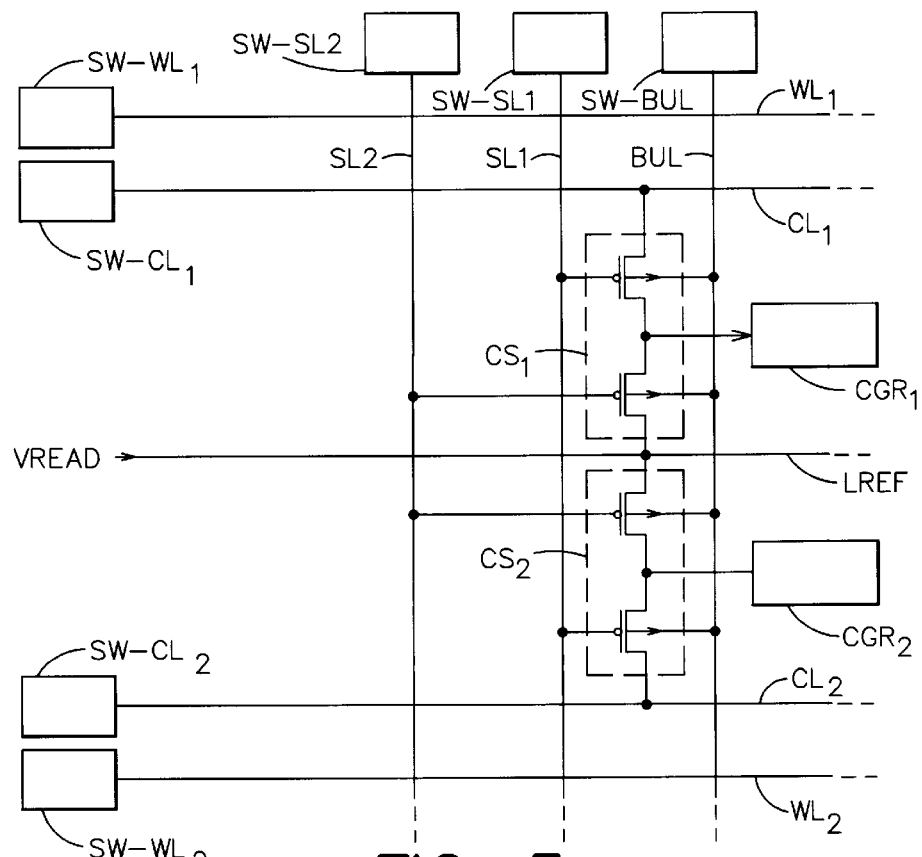
FIG. 3 gives a schematic view of a third exemplary embodiment of the invention.

It is also possible to arrange the reference lines parallel to the word and control lines. This example is shown in FIG. 3. The groups of cells connected to one and the same word line then have their second group selection transistors connected to one and the same reference line. In this case the word lines will, similarly and advantageously, be grouped together in sets of two, and the groups of cells connected to either of the two word lines grouped together will have their second group selection transistor connected to one and the same reference line with a view to the compactness of the memory. Thus, FIG. 3 shows two selection circuits CS1 and CS2 respectively connected to control lines CL1 and CL2, word lines WL1 and WL2 and a common reference line LREF.

The choice of whether to position the reference lines parallel to the bit lines or parallel to the word lines will depend on the number of bit lines and word lines, the surface area and the form that can be envisaged for the memory.

In practice, the bit lines will be made on a first metallization layer. The selection lines will extend in parallel to the bit lines. This will also be the case for these lines if it is desired to limit the number of layers of metallizations.

The control lines will be made on a second metallization layer. Indeed, since they extend in parallel to the word lines, it is necessary to make them on a different metallization layer to prevent the short-circuiting of the lines with one another. Inasmuch as there are two metallization layers available, it will be useful to make the word lines on the second metallization layer rather than on a polysilicon layer. Indeed, the resistivity is very much lower for a metal line. This limits the heating and the stabilization time needed to reach a desired potential.

As for the reference lines, depending on the option chosen, they will be made on the first or second metallization layer.

Although this description refers to first and second metallization layers, it is possible physically to make these layers respectively on top or beneath one another.

Reference shall now be made to the working of the memory, and especially the potentials present in the different conductive lines as a function of the mode of operation chosen.

1—Programming mode

If it is desired to program one or more cells of a group CGR, namely to inject electrons from the floating gates of their floating-gate storage transistors into their drains, the switching circuits will be activated so that:

the common source line SREF is put in a state of high impedance and the common well line BUL is taken to the potential VREAD, the bit line or lines BL1 to BLK, connected to the concerned cell or cells, are taken to the potential VCC, the word line WL to which the group is connected is taken to a potential greater than the potential VCC, for example the potential VP. Thus, the selection transistors associated with the cells to be programmed are on and the drain of the floating-gate storage transistors of these cells is at the potential VCC, the control line CL is taken to the potential HVN, the first selection line SL1. is taken to a potential lower than the potential HVN, for example the potential HVH, in such a way that the first group selection transistor TSG1 is on. The control gates of the floating-gate storage transistors of the group to be programmed are thus taken to the potential HVN, the second selection line SL2 is taken to a potential greater than the potential VREAD, for example the potential VCC, in such a way that the second group selection transistor TSG2 is off.

There is thus created a repellent field of about −13 V between the floating gates and the drains of the floating-gate storage transistors to be programmed. It can be seen that it would have also been possible to choose a potential HVN=−15 V and to take the bit lines to the potential GND. Preference will be given to the solution chosen which, by limiting the absolute value of the negative potential produced, reduces the number of pumping stages needed to produce it from VCC.

For the groups of cells connected to K bit lines which are distinct from the cell or cells to be programmed:

the first selection line SL1 is taken to a potential greater than HVN, for example the potential VCC, in such a way that none of the first group selection transistors is on, and the second selection line SL2 is taken to a potential lower than the potential VREAD, for example the potential GND, in such a way that the second group selection transistors TSG2 are on (the control gates of the floating-gate storage transistors therefore receive the potential VREAD present at the reference lines).

For the groups of cells connected to word lines which are distinct from that to which the cell or cells to be programmed are connected:

the corresponding control lines CL are taken to the potential VREAD, and the corresponding word lines are taken to the potential GND.

Thus, for a cell of a programmed group, VCC is imposed on the drain of the selection transistor, VP on the control gate of the selection transistor (in order to turn it on), and HVN on the control gate of the floating-gate storage transistor (in order to inject electrons from its floating gate to its drain).

For a cell of a different group connected to the same word line, GND (or a high impedance state) is imposed on the drain of the selection transistor, VP on the control gate of the selection transistor and VREAD on the control gate of the floating-gate storage transistor in such a way that there is no injection of electrons from the floating gate to the drain.

For a cell of a different group connected to the same bit line, VCC is imposed on the drain of the selection transistor, GND on the control gate of the selection transistor (in such a way that it is off) and VREAD on the control gate of the floating-gate storage transistor.

For a cell of a group connected to different word and bit lines, GND (or a high impedance state) is imposed on the drain of the selection transistor, GND on the control gate of the selection transistor and VREAD on the control gate of the floating-gate storage transistor.

2—Erasure mode

If it is desired to erase the cells of a group CGR, namely to inject electrons from the drains of their storage transistors to their floating gates, the switching circuits will be activated in such a way that:

the common source line SREF is taken to the potential GND and the common well line BUL is taken to the potential VPP, the word line WL to which the group is connected is taken to the potential VCC, all the bit lines of the memory are taken to the potential GND (they can also be left in a floating state). The selection transistors associated with the cells to be erased are therefore on, the control line CL is taken to the potential VPP, the first selection line SL1 of the group to be erased is taken to a potential lower than the potential VPP, for example the potential GND. The first group selection transistor TSG1 is therefore on, and the control gates of the storage transistors of the group CGR are taken to the potential VPP. An attracting field of the order of +15 V is thus created between the floating gates and the drains of the transistors to be erased, the second selection line SL2 is taken to a potential greater than the potential VREAD, for example the potential VPP, in such a way that the second group selection transistor TSG2 is off.

For the groups of cells connected to K bit lines distinct from those to which the cells to be erased are connected:

the first selection line SL1 is taken to the potential VPP, and the second selection line SL2 is taken to a potential below the potential VREAD, for example to the potential GND, in such a way that the second group selection transistor is on (the control gates of the floating-gate transistors therefore receive the potential VREAD).

For the groups of cells connected to word lines which are distinct from those to which the cells to be erased are connected:

the corresponding control lines are taken to the potential VREAD, and the corresponding word lines are taken to the potential GND.

Thus, for a cell of an erased group, GND is imposed on the drain of the selection transistor, VCC on the control gate of the selection transistor (in order to turn it on), and VPP on the control gate of the floating-gate storage transistor, in order to produce an attracting field.

For a cell of a different group connected to the same word line, GND is imposed on the drain of the selection transistor, VCC on the control gate of the selection transistor and VREAD on the control gate of the floating-age storage transistor in such a way that the difference in potential between the floating gate and the drain is not enough to erase the contents of the storage transistor.

For a cell of a different group connected to the same bit line, GND is imposed on the drain of the selection transistor, GND on the control gate of the selection transistor and VREAD on the control gate of the floating-gate storage transistor.

For a cell of a group connected to different word and bit lines, GND is imposed on the drain of the selection transistor, GND on the control gate of the selection transistor and VREAD on the control gate of the floating-gate storage transistor.

3—Read mode

If it is desired to read a storage cell of a group CGR, the switching circuits will be activated in such a way that:

the common source line SREF is taken to the potential GND and the common well line BUL is taken to the potential VCC, all the control lines CL are taken to the potential VREAD, the word line WL to which the cell to be read is connected is taken to a potential greater than the potential VS, for example to the potential VCC, in such a way that the selection transistor of the cell to be read is on;

the bit line to which the cell is connected is connected to the potential VS. The other bit lines are left in a state of high impedance;

the first selection line SL1 is taken to a potential lower than the potential VREAD, for example the potential GND, in such a way that the first group selection transistor TSG1 of the group of the cell to be read is on, the second selection line SL2 is taken to a potential greater than the potential VREAD, for example the potential VCC, in such a way that the second group selection transistor of the group of the cell to be read is off, thus enabling the insulation of the corresponding control line.

For a group of cells connected to K distinct bit lines and to the same word line as those to which the cell to be read is connected:

the first selection line SL1 is taken to a potential greater than the potential VREAD, for example the potential VCC, in such a way that the first group selection transistor TSG1 is off, and the second selection line SL2 is taken to a potential below the potential VREAD, for example to the potential GND, in such a way that the second group selection transistor TSG2 is on (the control gates of the floating-gate transistors of the group therefore receive the potential VREAD).

For a group of cells connected to a word line distinct from those to which the cell to be read is connected, the corresponding word lines are taken to the potential GND.

Thus, for a cell to be read, VS is imposed on the drain of the selection transistor, VCC on the control gate of the selection transistor (in such a way that it is on), and VREAD on the control gate of the floating-gate storage transistor in such a way that it is on too.

For another cell connected to the same word line, a state of high impedance is imposed on the drain of the selection transistor, VCC on the control gate of the selection transistor and VREAD on the control gate of the floating-gate storage transistor.

For a cell of a different group connected to the same bit line, VS is imposed on the drain of the selection transistor, GND on the control gate of the selection transistor (in such a way that it is off) and VREAD on the control gate of the floating-gate storage transistor.

For a cell of a different group connected to different word and bit lines, a state of high impedance is imposed on the drain of the selection transistor, GND on the control gate of the selection transistor and VREAD on the control gate of the floating gate storage transistor.

For the sake of conciseness, the control circuits of the switching circuits shall not be described in detail. Typically, these circuits will be combinational logic circuits producing control signals as a function of the mode chosen, the word line selected and the bit line or lines selected. Since the working of the memory (and more particularly the position of the switching circuits as a function of the chosen mode) have been described here above, those skilled in the art will have no particular difficulty in making them.

Figure 2:
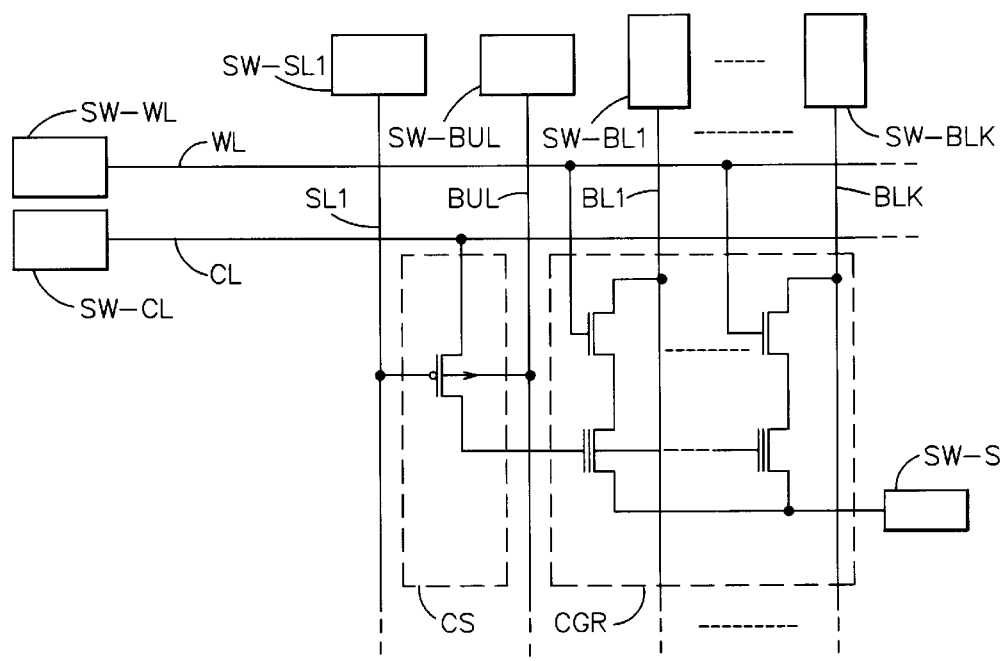
FIG. 2 gives a schematic view of a second exemplary embodiment of the invention.

Although the description refers to a second selection line and to a reference line, it will be understood that their presence is not strictly necessary to program, erase or read the storage cells. Their function, as described, is solely that of ensuring the presence, in all circumstances, of a defined potential at the control gates of the floating-gate storage transistors. It is possible, if it is accepted that these control gates may be left in a floating state, to use selection circuits having only one transistor and to eliminate the second selection lines and the reference lines. This example, which enables the amount of space required by the memory to be reduced, is illustrated in FIG. 2.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. An EEPROM, programmable and erasable by Fowler-Nordheim effect, organized in matrix form in N word lines and M bit lines, N and M being integers greater than one, and comprising:

storage cells placed at intersections of the word lines and the bit lines and comprising floating-gate storage transistors with N type doping to store electrical states, the storage cells being grouped together in groups of K cells, K being an integer greater than one and less than M, the storage cells of a same group being connected to a same word line and to K distinct bit lines;

first selection lines and control lines associated with the groups of cells to convey control potentials for programming, erasure and reading of the storage cells; and for each group of storage cells, a first group selection transistor with P type doping and having a channel for connecting, through the channel, floating gates of the floating-gate storage transistors of a same group of cells to one of the control lines, wherein a control gate of the first group selection transistor is connected to one of the first selection lines when for programming, erasing and reading contents of the storage cells of the group of cells with which the first group selection transistor is associated.

2. A memory according to claim 1, comprising N control lines arranged so that all the groups of cells connected to a same word line have their first group selection transistors connected to a same control line.

3. A memory according to claim 2, wherein the memory comprises switching means to carry the first selection and control lines to different selection and control potentials, such that only one group of cells connected to a same word line is connected simultaneously to the control line associated with this word line.

4. A memory according to claim 2, wherein the first group selection transistor of groups of cells having cells connected to K same bit lines is connected to a same first selection line.

5. A memory according to claim 3, wherein the first group selection transistor of groups of cells having cells connected to K same bit lines is connected to a same first selection line.

6. A memory according to claim 1, comprising:

second selection lines associated with the groups of cells and with at least one reference line to convey selection and reference potentials; and for each group of cells, a second group selection transistor with P type doping and having a channel for connecting, through the channel, floating gates of the floating-gate storage transistors of the group of cells to the at least one reference line, wherein a control gate of the second selection transistor is connected to one of the second selection lines, such that potentials of control gates of the floating-gate storage transistors of cells of an associated group are in a non-floating state when the control gates are insulated from the control line associated with the group of cells.

7. A memory according to claim 4, comprising:

second selection lines associated with the groups of cells, and with at least one reference line, to convey selection and reference potentials; and for each group of cells, a second group selection transistor with P type doping and having a channel for connecting, through the channel, floating gates of the floating-gate storage transistors of the group of cells to the at least one reference line, wherein a control gate of the second selection transistor is connected to one of the second selection lines, such that potentials of control gates of the floating-gate storage transistors of cells of an associated group are in a non-floating state when the control gates are insulated from the control line associated with the group of cells.

8. A memory according to claim 6, wherein the groups of cells whose cells are connected to K same bit lines have their second selection transistor connected to a same reference line.

9. A memory according to claim 8, wherein the bit lines are grouped together in sets of K lines, these sets of K lines being grouped two by two, and wherein groups whose cells are connected to one of two sets of K bit lines grouped together have their second group selection transistor connected to a same reference line.

10. A memory according to claim 6, wherein the groups of cells whose cells are connected to K same bit lines have their second group selection transistor connected to a same second selection line.

11. A memory according to claim 6, wherein the groups of cells connected to a same word line have their second group selection transistor connected to a same reference line.

12. A memory according to claim 11, wherein the word lines are grouped together two by two, and wherein the groups of cells connected to either of two word lines that are grouped together have their second group selection transistor connected to a same reference line.

13. A memory according to claim 1, wherein the bit lines and the selection lines are made on a same metallization layer, and wherein the control lines are made on a second metallization layer.

14. A memory according to claim 6, wherein the bit lines and the selection lines are made on a same metallization layer, and wherein the control lines are made on a second metallization layer.

15. A memory according to claim 6, wherein the bit lines, the selection lines and the reference lines are made on a same first metallization layer, and wherein the control lines are made on a second metallization layer.

16. A memory according to claim 13, wherein the word lines are made on the second metallization layer.

17. A memory according to claim 14, wherein the word lines are made on the second metallization layer.

18. A memory according to claim 15, wherein the word lines are made on the second metallization layer.

19. A memory, having a program mode, a read mode, and an erase mode, the memory comprising:

at least one word line and at least one bit line;

a plurality of storage cells, each having a floating gate storage transistor, forming at least one group of storage cells, each connected to the at least one word line and each connected to a separate one of the at least one bit line;

for each group of storage cells, a group selection circuit connected to the floating gate storage transistors of the plurality of storage cells in the group to control the plurality of storage cells in the group during a read, program and erase mode;

wherein the group selection circuit further comprises a first group selection transistor, having a first terminal connected to each of the storage cells of the at least one group of storage cells, a second terminal connected to a first selection line and a third terminal connected to a control line, wherein the first selection line and the control line convey control potentials for programming, erasure and reading of the storage cells, and a well connected to a common well line, wherein each storage cell in the group comprises a selection transistor and a floating-gate storage transistor having a control gate, wherein each control gate of each of the floating-gate storage transistors are connected to one another; and wherein the first terminal of the single group selection transistor connects to the control gate of each of the floating-gate storage transistors.

20. The memory according to claim 19, further comprising:
   a means for maintaining the potential of the control gate of the floating-gate storage transistors in a non-floating state.

21. The memory according to claim 19, wherein:
   each transistor includes sources which are single diffused; and
   wherein the floating-gate storage transistor contains N-type doping to store electrical states according to the Fowler-Nordheim effect.

22. The memory according to claim 19, wherein connections for the at least one group of storage cells, which are connected to bit lines other than the at least one bit line to which a group of storage cells to be erased and programmed are connected, comprise:
   the first selection line associated with the at least one group is connected, via a first selection line switching circuit associated with each of the at least one group, to a first voltage.

23. The memory according to claim 19, wherein connections for the at least one group of storage cells, connected to a word line other than a word line to which a group of storage cells to be erased and programmed is connected, comprise:
   the control line associated with the at least one group is connected, via a control line switching circuit associated with each of the at least one group, to a first voltage; and
   a word line associated with the at least one group is connected, via a word line switching circuit associated with each of the at least one group, to a ground voltage.

24. The memory according to claim 19, further comprising:
   means for adjusting the potentials of the control line, the common well line, the first selection line, the common word line, and certain of the at least one bit line so as to allow the plurality of storage cells to be programmed, read, and erased.

25. The memory according to claim 19, wherein:
   a first terminal of each of the selection transistor of each of the plurality of storage cells is connected to a different one of the at least one bit line, and a second terminal of each of the selection transistor of each of the plurality of storage cells of the group is connected to a common word line of the at least one word line, and a third terminal of each of the selection transistor of each of the plurality of storage cells is connected to a drain of the floating-gate storage transistor within a same storage cell; and
   wherein all sources of the floating-gate storage transistors are connected to a common source line.

26. The memory according to claim 25, further comprising:
   a source switching circuit enabling connection of the common source line to one of the following connections in the at least one group consisting of:
   a first voltage, or
   a state of high impedance;
   at least one word line switching circuit, enabling connection of each of the at least one word line to one of the following connections in the at least one group consisting of:
   a first voltage of,
   a second voltage, or
   a third voltage;
   at least one bit line switching circuit, enabling connection of each of the at least one bit line to one of the following connections in the at least one group consisting of:
   a first voltage,
   a state of high impedance,
   a second voltage, or
   a third voltage;
   a first selection line switching circuit enabling connection of the first selection line to one of the following connections in the at least one group consisting of:
   a first voltage,
   a second voltage,
   a third voltage; or
   a fourth voltage;
   a well switching circuit enabling connection of the common well line to one of the following connections in the at least one group consisting of:
   a first voltage,
   a second voltage, or
   a third voltage; and
   a control line switching circuit enabling connection of the control line to one of the following connections in the at least one group consisting of:
   a first voltage,
   a second voltage, or
   a third voltage.

27. The memory according to claim 19, wherein the single group selection circuit further comprises:
   a second group selection transistor, having a first terminal connected to the first terminal of the first group selection transistor and having a second terminal connected to a second selection line and a third terminal connected to a reference line, and a well connected to a common well line.

28. The memory according to claim 27, wherein connections for groups of storage cells, connected to bit lines other than the at least one bit line to which a group of storage cells to be erased and programmed are connected, comprise:
   the first selection line associated with the at least one group is connected, via a first selection line switching circuit associated with each of the at least one group, to a first voltage; and
   the second selection line associated with the at least one group is connected, via a second selection line switching circuit associated with each of the at least one group, to a ground voltage.

29. The memory according to claim 27, wherein connections for groups of storage cells connected to word lines other than the word line to which the at least one group of storage cells to be erased and programmed is connected, comprise:
   the control line associated with the at least one group is connected, via a control line switching circuit associated with each of the at least one group, to a first voltage; and
   the word line associated with the at least one group is connected, via a word line switching circuit associated with each of the at least one group, to a ground voltage.

30. The memory according to claim 27, wherein
   the first and second selection lines are parallel to the at least one bit line.

31. The memory according to claim 27, wherein
   the first and second selection lines are parallel to the at least one word line.

32. The memory according to claim 27, wherein the reference lines are parallel to word lines and control lines.

33. The memory according to claim 27, wherein:

a first terminal of each of the selection transistor of each of the plurality of storage cells is connected to a different one of the at least one bit line, and a second terminal of each of the selection transistor of each of the plurality of storage cells of the at least one group is connected to a common word line of the at least one word line, and a third terminal of each of the selection transistor of each of the plurality of storage cells is connected to a drain of the floating-gate storage transistor within a same storage cell; and wherein all sources of the floating-gate storage transistors are connected to a common source line.

34. The memory according to claim 33, further comprising:

a source switching circuit enabling connection of the common source line to one of the following connections in the group consisting of:
a first voltage, or
a state of high impedance;

at least one word line switching circuit, enabling connection of each of the at least one word line to one of the following connections in the at least one group consisting of:
a first voltage,
a second voltage, or
a third voltage;

at least one bit line switching circuit, each enabling connection of each of the at least one bit line to one of the following connections in the at least one group consisting of:
a first voltage,
a state of high impedance,
a second voltage, or
a ground voltage;

a first selection line switching circuit enabling connection of the first selection line to one of the following connections in the at least one group consisting of:
a first voltage,
a second voltage,
a third voltage; or
a fourth voltage;

a second selection line switching circuit enabling connection of the second selection line to one of the following connections in the at least one group consisting of:
a first voltage,
a second voltage; or
a third voltage;

a well switching circuit enabling connection of the common well line to one of the following connections in the at least one group consisting of:
a first voltage,
a second voltage, or
a third voltage; and a control line switching circuit enabling connection of the control line to one of the following connections in the at least one group consisting of:
a first voltage,
a second voltage, or
a third voltage.

35. An EEPROM, programmable and erasable by Fowler-Nordheim effect, organized in matrix form in N word lines and M bit lines, N and M being integers greater than one, and comprising:

a plurality of storage cells, wherein the plurality of storage cells are grouped in groups of K storage cells, K being an integer greater than one and less than M, and wherein each storage cell comprises:

a floating-gate storage transistor to store electrical states and having a gate and a drain, wherein the floating gate transistors of storage cells of a same group are connected; and a selection transistor having a gate connected to one of the word lines and a drain connected to a distinct one of the bit lines and a source connected to the drain of the floating-gate storage transistor, wherein the selection transistors of storage cells of a same group are connected to a same one of the word lines, and a group selection circuit for each of the groups of storage cells, comprising a first group selection transistor having a gate connected to a selection line, a source connected to a control line, and a drain connected to the floating gates of the floating-gate storage transistors of the group of storage cells.

* * * * *